Sept. 15, 1970 R. A. BALLARD 3,529,212

PRINTED CIRCUIT ASSEMBLY

Filed Dec. 26, 1967

INVENTOR.
Robert A. Ballard
BY
Walter S. Zaborski
ATTORNEY

United States Patent Office 3,529,212
Patented Sept. 15, 1970

3,529,212
PRINTED CIRCUIT ASSEMBLY
Robert A. Ballard, Bradford, Pa., assignor to Corning Glass Works, Corning, N.Y., a corporation of New York
Filed Dec. 26, 1967, Ser. No. 693,267
Int. Cl. H05k *1/18*
U.S. Cl. 317—101 4 Claims

ABSTRACT OF THE DISCLOSURE

A printed circuit assembly wherein leadless electrical components are substantially wholly contained within apertures in the circuit substrate.

BACKGROUND OF THE INVENTION

Ordinarily, discrete electrical components such as resistors, capacitors, inductors, transistors, and the like were attached to perforated printed circuits or microcircuits by taking the leads of the components, suitably bending them, inserting them in the conductive paths and substrate, and thereafter soldering or otherwise welding the leads to the conductive paths. The wire leads would form both the structural support for the components as well as the electrical connection to the various conductors within the circuit. Such components would stand off from the surface of the circuit substrate and would substantially increase the space necessary for housing the circuit. Also, such components have been subject to damage because of their protrusion from the substrate surface.

SUMMARY OF THE INVENTION

The objects of the present invention are to provide a suitable, direct, and economic means for attaching discrete electrical components to printed circuits, as hereinafter defined, wherein the resulting assembly will be rugged, minimizes the requirement for soldering and welding, whose overall thickness and cost of production is significantly less than heretofore known circuit assemblies, and one which overcomes the hereinabove noted disadvantages.

Briefly, according to the present invention a circuit assembly is provided comprising a plurality of electrical conductors formed on an apertured dielectric substrate and a leadless electrical component having at least a pair of electrical terminals or contact areas disposed within the aperture with the aperture defining region of the substrate closely surrounding the component such that it may be maintained within the aperture by frictional or other means. The component may be substantially wholly contained within the body of the substrate. Means are provided for electrically connecting the component terminals to selected portions of the electrical conductors.

Additional objects, features, and advantages of the present invention will become apparent to those skilled in the art from the following detailed description and the attached drawing on which, by way of example, only the preferred embodiments of this invention are illustrated.

DETAILED DESCRIPTION

By the term electrical component as used herein is meant any active or passive element such as a resistor, capacitor, inductor, junction device such as a transistor or diode, and the like, and the present invention is in no way limited to any particular electrical component. By the term printed circuit as used herein is meant any system of electrical conductors and electrical components formed in or on a substrate, or applied or attached to a substrate, including microcircuits. For example, electrical conductors may be applied to a substrate such as by inking, painting, screening, or the like, or may be diffused into the substrate by methods well known in the art.

Figure 1:
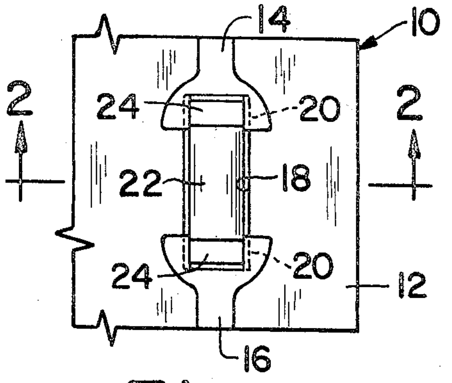
FIG. 1 is a fragmentary plan view of one embodiment of the present invention wherein a leadless component is connected to an electrical circuit.
Figure 2:
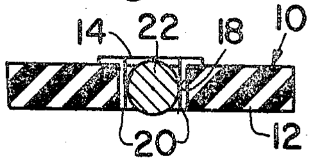
FIG. 2 is a cross-sectional elevation of the assembly of FIG. 1 along line 2—2 thereof.

Referring to FIGS. 1 and 2, there is shown a fragmentary view of a printed circuit assembly 10 comprising a substrate 12 on which conductors 14 and 16 have been formed. Methods of applying such conductors are well known in the art. One such method may be to apply a uniform metallic coating over the entire surface of the substrate by, for example, vapor deposition and thereafter removing the unwanted portions by suitable masking and acid etching. An aperture 18 is formed within substrate 12 by any means well known in the art such as punching, etching, or the like. Substrate 12 may be formed of any suitable material such as glass, ceramics, plastics, glass-ceramics, composition materials, and the like. Conductive members 20 are extended into aperture 18 and adhered to the ends of the aperture defining sidewall region of substrate 12. Conductive members 20 may be formed integrally with conductors 14 and 16 or may be separately formed, disposed within the aperture and electrically connected to conductors 14 and 16.

A leadless electrical component 22 is provided having a pair of contact areas or terminals 24 formed at the ends thereof. Contact to the electrical component is made through such terminals 24. Ordinarily, leads would be attached to such terminals for subsequent connection to an electrical circuit. The dimensions of aperture 18 and component 22 are carefully selected so that the aperture defining regions of the substrate closely surround electrical component 22 and provide a snug, tight fit therewith whereby component 22 may be inserted into aperture 18 and maintained therewithin by frictional forces between the component terminals and the conductive members, no further mechanical support being necessary. Direct mechanical and electrical contact is made at each end of component 22 by means of terminals 24 being in firm contact with conductive members 20.

As is shown in FIG. 2, the thickness of substrate 12 may be less than the diameter or thickness of component 22; however, as is readily understood by one familiar with the art, the component may have the same thickness as substrate 12 or may be smaller than the thickness of substrate 12. Since the component is substantially wholly contained within the body of substrate 12 the protrusion of the component beyond the substrate surfaces is either greatly minimized or completely eliminated depending on the relative dimensions of component 22 and substrate 12.

Figure 3:
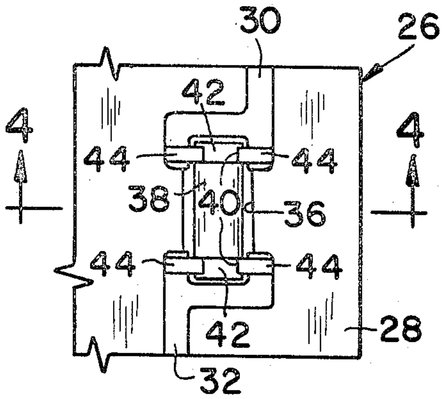
FIG. 3 is a fragmentary plan view of another embodiment of a leadless electrical component connected to an electrical circuit.
Figure 4:
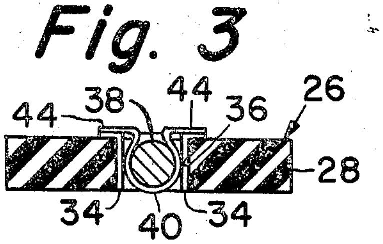
FIG. 4 is a cross-sectional elevation of the assembly of FIG. 3 along line 4—4 thereof.

Referring now to FIGS. 3 and 4, a fragmentary view of another embodiment of a printed circuit assembly of the present invention is illustrated. Printed circuit assembly 26 comprises a substrate 28, conductors 30 and 32, conductive members 34, aperture 36, and electrical component 38 substantially as described in connection with FIGS. 1 and 2. In addition, a U-shaped clamp 40 is snugly fitted about each end of component 38 in electical contact with contact areas or terminals 42. Each U-shaped member 40 has a pair of flanges 44 extending from the open end thereof. This subassembly is then fitted within aperture 36 which has been formed of a size to closely surround component 38. Component 38 and U-shaped clamps 40 are maintained within the aperture by means of frictional forces between clamp 40 and conductive members 34. Such a structure provides suitable mechanical rigidity and electrical continuity between conductors 30 and 32 and element 38. However, in this embodiment flanges 44 may be soldered or resistance welded to conductors 30 and 32 to provide additional mechanical rigidity and increased contact area for improved electrical continuity, if desired.

Figure 5:
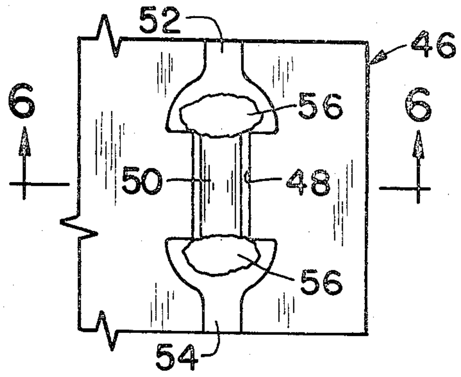
FIG. 5 is a fragmentary plan view of still another embodiment of a leadless electrical component attached to a circuit.
Figure 6:
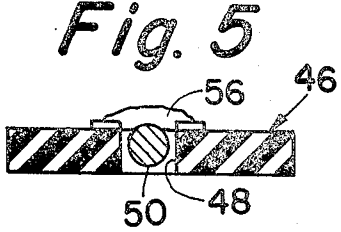
FIG. 6 is a cross sectional elevation of the assembly of FIG. 5 taken along line 6—6 thereof.

FIGS. 5 and 6 illustrate a fragmentary view of printed circuit assembly 46 which is similar to that illustrated in FIGS. 1 and 2 except that no conductive members are disposed within aperture 48. Aperture 48 is formed so as to closely surround but not necessarily contact electrical component 50. Component 50 is maintained within aperture 48 and electrical contact is obtained between the terminals of the component and conductors 52 and 54 by means of solder or weld material 56 which is applied to each end of component 50 and the aperture surrounding portions of conductors 52 and 54. In FIGS. 5 and 6 the diameter of component 48 is illustrated to be substantially smaller than the thickness of substrate 57. As heretofore stated, this dimension relationship is possible with any of the embodiments described while a component having a diameter larger than the thickness of substrate 57 is possible in this embodiment.

Figure 7:
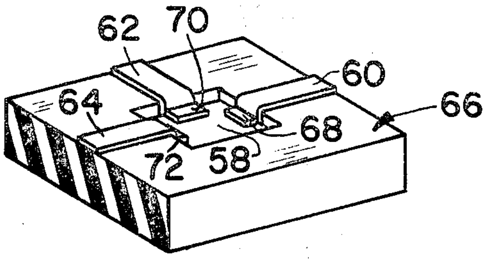
FIG. 7 is an oblique view of a still further embodiment of the circuit assembly of the present invention.

FIG. 7 illustrates an electrical component 58 connected to conductors 60, 62, and 64 of printed circuit assembly 66 by means of friction forces in a manner similar to that described in connection with FIGS. 1 and 2. Component 58 is illustrated as having a noncircular cross section and having a generally parallelpiped shape. Contact between component 58 and the conductors of printed circuit assembly 66 is effected through contact areas or terminals 68, 70, and 72. Component 58 may be a junction device such as a transistor or the like. As is readily seen to one familiar with the art, any shape of component may be connected to a printed circuit assembly and disposed substantially wholly within an aperture of a printed circuit assembly substrate in accordance with this invention. As will also be readily understood by one familiar with the art, only fragmentary portions of complete printed circuit assemblies are illustrated. A complete printed circuit assembly may contain many conductors or conductive paths as well as numerous electrical components.

A typical example of the present invention will be described in connection with the embodiment illustrated in FIGS. 1 and 2. The rectangular aperture 18 is formed within a glass ceramic substrate 12 by chemical etching. Thereafter, copper conductors 14 and 16 are printed on the flat surface of substrate 12 in the form of a slurry. To the ends of the sidewalls is applied a copper slurry to form conductive members 20. The unit is then fired in the customary manner to form a metallic film bonded to the surface of substrate 12 as well as the ends of the sidewalls defining aperture 18.

An electrical resistor is provided comprising a tubular glass substrate upon which a resistive metal oxide film is applied. Silver bands are applied to the ends thereof to form the resistor terminals. The component is then forceably fitted within aperture 18 which closely surrounds the component and maintains it within the aperture by means of friction forces. Electrical contact is made between the resistance film and conductors 14 and 16 by means of conductive members 20 which are in direct electrical and mechanical contact with silver terminals 24.

It was found that the above assembly provided a rigid printed circuit structure wherein the electrical resistor did not substantially protrude beyond the flat surfaces of the substrate and which clearly reduced the overall thickness of the resulting assembly and provided a simple, direct, and inexpensive manner of connecting a leadless resistor to the conductive members of a printed circuit assembly.

I claim:

1. A printed circuit assembly comprising
a plurality of electrical conductors formed at the surface of an apertured substrate,
a leadless electrical component having at least a pair of electrical terminals, disposed within said aperture,
the aperture defining region of said substrate closely surrounding said component,
a plurality of conductive members equal in number to the number of said electrical terminals,
each of said conductive members being disposed within said aperture along the defining wall region of said substrate adjacent said electrical terminals, said conductive members being electrically connected to selected portions of said conductors, and
a U-shaped clamp disposed in contact with each said terminal whereby the electrical continuity between said component and said conductors is maintained through said U-shaped clamp,
said component being substantially wholly contained within the body of said substrates.

2. The printed circuit assembly of claim 1 wherein said electrical conductors branch into two separate conductive paths in the vicinity of each of said electrical terminals, and said U-shaped clamps have flanges, which extend over and contact said separate conductive paths.

3. A printed circuit assembly comprising
a plurality of electrical conductors formed on an apertured dielectric substrate,
a tubular leadless electrical component having a pair of terminals about the ends thereof disposed within said aperture with the longitudinal axis thereof substantially parallel to the plane of said conductors,
conductive members extending from selected portions of said conductors to within said aperture along the aperture defining wall region of said substrate corresponding to said terminals, and
a U-shaped clamp disposed in contact with each said terminal whereby the electrical continuity between said component and said conductors is maintained through said U-shaped clam,
said components being substantially wholly contained within the body of said substrate.

4. A printed circuit assembly comprising
a dielectric substrate having top and bottom surfaces,
at lease one elongated aperture extending through said substrate between said top and bottom surfaces,
a pair of electrical conductors formed at the surface of said substrate and extending to the periphery of said aperture at each end thereof, said electrical conductors branching into separate conductive paths that extend along a portion of the longitudinal sides of said aperture, an elongated leadless electrical component having a pair of terminals about the ends thereof disposed within said aperture, the aperture defining region of said substrate closely surrounding said component, a pair of conductive members extending from said conductors to within each end of said aperture along the aperture defining wall region of said substrate adjacent said terminals, a U-shaped clamp surrounding and in contact with a major portion of the periphery of each of said terminals, and a pair of flanges which extend from each of said clamps and contact said separate conductive paths, said U-shaped members being snugly fitted between said terminals and said conductive members so that said component is maintained within said aperture and so that said terminals are maintained in electrical contact with said conductive members solely by the tight fit between said U-shaped members, said terminals and said conductive members.

References Cited

UNITED STATES PATENTS

| | | | |
|---|---|---|---|
| 2,903,627 | 9/1959 | McGarvey. | |
| 3,114,080 | 12/1963 | Koda et al. | 174—68.5 XR |
| 3,219,886 | 11/1965 | Katzin. | |
| 3,390,308 | 6/1968 | Marley. | |
| 3,105,729 | 10/1963 | Rosenthal et al. | |

DARRELL L. CLAY, Primary Examiner

U.S. Cl. X.R.

29—626; 174—68.5